United States Patent [19]
Buynoski

[11] Patent Number: 5,825,066
[45] Date of Patent: Oct. 20, 1998

[54] CONTROL OF JUCTION DEPTH AND CHANNEL LENGTH USING GENERATED INTERSTITIAL GRADIENTS TO OPPOSE DOPANT DIFFUSION

[75] Inventor: Mathew S. Buynoski, Palo Alto, Calif.

[73] Assignee: Advanced Micro Devices, Inc., Sunnyvale, Calif.

[21] Appl. No.: 979,876

[22] Filed: Nov. 26, 1997

Related U.S. Application Data

[63] Continuation of Ser. No. 647,081, May 8, 1996, abandoned.

[51] Int. Cl.$^6$ ............................ H01L 29/76; H01L 29/94; H01L 31/062; H01L 31/113
[52] U.S. Cl. ........................ 257/345; 257/344; 257/408; 257/607; 257/655
[58] Field of Search .................................... 257/344, 345, 257/408, 607, 655

[56] References Cited

U.S. PATENT DOCUMENTS

| | | | |
|---|---|---|---|
| 4,558,507 | 12/1985 | Okabayashi et al. | 29/571 |
| 5,019,520 | 5/1991 | Komori et al. | 437/26 |
| 5,145,794 | 9/1992 | Kase et al. | 437/26 |
| 5,223,445 | 6/1993 | Fuse | 437/24 |
| 5,245,208 | 9/1993 | Eimori | 257/344 |
| 5,399,883 | 3/1995 | Baliga | 257/57 |
| 5,468,974 | 11/1995 | Aronowitz et al. | 257/51 |
| 5,514,902 | 5/1996 | Kawasaki et al. | 257/607 |
| 5,585,286 | 12/1996 | Aronowitz et al. | 437/24 |

FOREIGN PATENT DOCUMENTS

| | | | |
|---|---|---|---|
| 2 578 096 | 2/1985 | France | H01L 1/265 |
| 61-047670 | 8/1986 | Japan | H01L 29/78 |
| WO 85/00694 | 2/1985 | WIPO | H01L 21/265 |

OTHER PUBLICATIONS

"Suppression of the Lateral Diffusion Under the Gate of an MOS Transistor by Argon Implantation", J.C. Marchetaux et al., IEEE Transactions on Electron Device, ED–32, No. 1985, pp. 2508–2510.

"The Effect of Argon Implantation on the Conductivity of Boron Implanted Silicon", I.R. Sanders et al., Solid State Electronics, 1977, vol. 20, pp. 703–707.

"Effect of Argon Implantation on the Activation of Boron Implanted in Silicon", A. Milgram et al., Applied Physics Letters, May 15, 1983, vol. 42, No. 10, pp. 878–880.

Milgram et al., Applied Physics Letters 42, pp. 878–880 (1983).

Arnowitz, et al., J. Appl. Phys, 63(4), 15 Feb. 1988, pp. 1037–1040.

Delfino, et al., Applied Physics Letters 44(6), Mar. 15 1984, pp. 594–596

Primary Examiner—Ngân V. Ngô
Attorney, Agent, or Firm—Gerald M. Fisher

[57] ABSTRACT

An improved manufacturing process and an improved device made by the process for retarding diffusion of implanted dopants during subsequent high-temperature processing. A layer of an electrically inactive species is implanted well below the active dopant layers, and the excess interstitials due to damage from the electrically inactive species layer form a retarding gradient which opposes dopant diffusion. Using this process, shallow source-drain junctions can be achieved, and lateral encroachment of LDD implants under the gate can be minimized.

9 Claims, 7 Drawing Sheets

CONTROL OF JUCTION DEPTH AND CHANNEL LENGTH USING GENERATED INTERSTITIAL GRADIENTS TO OPPOSE DOPANT DIFFUSION

This application is a continuation of application Ser. No. 08/647,081 filed May 8, 1996, now abandoned.

FIELD OF THE INVENTION

This invention relates to processes for the formation of shallow implanted regions, and for inhibition of dopant diffusion in integrated circuits.

BACKGROUND OF THE INVENTION

As integrated circuits become smaller and faster, MOS device structures have evolved to necessitate increasingly short channels and shallow junction depths. This presents challenges in the processing of these structures, including ion implantation of dopants to form source, drain, and Lightly Doped Drain (LDD) regions.

Ions are implanted by directing them in a high-energy beam at a target. The ions penetrate a distance into the target, the distance being determined by factors such as ion mass, ion energy, target material and target orientation. The ions are decelerated within the target by a series of collisions or scattering events of two types: collisions with or scattering from the core electrons and nuclei of the target material, and Coulombic interactions with the outer electrons of the target material. If the energy of the ion at any point along its trajectory in the target is given by E, the energy loss due to nuclear collisions is characterized by an energy loss per unit length, $S_n(E)$, called nuclear stopping. The energy loss from interactions with target outer electrons is characterized by an energy loss per unit length $S_e(E)$, called electronic stopping. The total rate of energy loss per unit length is given by the sum of $S_n(E)$ and $S_e(E)$.

A widely used scattering model for calculating nuclear stopping power $S_n(E)$, utilizes a modified Thomas-Fermi screened atomic scattering potential. Based on this model, nuclear stopping increases linearly at low energies, reaches a maximum at some intermediate energy, and decreases at high energies. Nuclear stopping increases with the mass of the implanted ion. The electronic stopping due to inelastic scattering from target outer electrons behaves similarly to stopping of a projectile in a viscous medium, and is approximately proportional to $E^{1/2}$ in the form $S_e(E) \propto k_e E^{1/2}$, with $k_e$ being a constant which is weakly dependent on the ion and target materials.

At low ion energies, nuclear stopping dominates, and there is a threshold energy above which electronic scattering becomes dominant. This crossover energy is dependent on ion mass, being higher for heavier ions. By way of example, for boron, $S_e(E)$ is the predominant energy loss mechanism for ion energies greater than approximately 10 KeV.

The theoretical distribution of implanted ions would be Gaussian in shape, having a peak at a depth called the projected range, $R_p$. Actual distributions deviate from the ideal, due to channeling effects which occur during implantation, and post-implant dopant diffusion.

Channeling during implantation occurs when the high energy ions travel in a single-crystal substrate in directions corresponding to channels. Channels in a single-crystal lattice are aligned in directions along which the ions do not encounter any target nuclei. The ions are channeled or steered along such open channels of the lattice. Those implanted ions that travel down channels are slowed mainly by electronic stopping, and therefore can penetrate the lattice more deeply than can non-channeled ions. Channeling is extremely sensitive to incident beam direction relative to the lattice in the target. It is difficult to control, and tends to cause anomalous implant profile tails.

Implantation is generally followed by heat treatment to electrically "activate" the implanted ions, which gives the substrate the acceptor or donor behavior. This heat treatment, along with other heat treatments in subsequent processing, also causes diffusion of the implanted ions, which has adverse effects such as increasing the junction depth for source/drain implants, thereby degrading device performance. Diffusion rates vary for the typically used dopants, boron, arsenic, and phosphorus, with boron having the highest diffusion rate. Therefore, diffusion effects are greatest in those PMOS devices which utilize acceptor boron atoms as p-type dopants.

Much effort has been devoted to finding methods of inhibiting undesired positioning and change of positioning of dopants such as boron, during implantation and during post-implant MOS device processing. Many of these methods of inhibiting positional changes utilize the effects of damage associated with implantation. The effective employment of implant-induced damage requires understanding of damage profiles and the physics of damage creation.

Nuclear collisions between energetic implanted ions and the target can cause damage to the target. For a single crystal silicon target substrate, this damage generally consists of displacing silicon atoms from their crystalline lattice sites. In order for a displacement event to occur, the energy transferred to the silicon atom from the collision must be greater than $E_{di}$, the energy required to displace it from its lattice site. For Si, this value of $E_{di}(Si) \cong 15$ eV. A displacement event in Si may yield a vacancy, an unoccupied lattice site. The vacancy may be accompanied by a Si atom occupying a place between lattice sites, called an interstitial Si atom. This vacancy-interstitial Si atom pair forms a point defect known as a Frenkel pair. The implanted ions create zones of gross disorder populated by defects in the regions where they deposit their kinetic energy. The lattice may exhibit several degrees of damage: a) isolated point defects or defect clusters in essentially crystalline silicon; b) local amorphous zones in an otherwise crystalline layer; or c) complete amorphization. An amorphous region is defined as a region lacking crystalline periodicity, and may be described as a region in which the density of displaced atoms per unit volume approaches the atomic density of the semiconductor.

When only electronic scattering events occur, there is insufficient energy transfer to the Si atoms to cause displacement, so that widespread damage does not begin to occur until the ion energy has decreased to the point where nuclear stopping becomes significant. As the ion energy further decreases to below $E_{di}$, displacement damage ceases. Thus, the highly damaged region in the Si is positioned somewhat shallower than the dopant-implanted region. A graphical representation of damage density profiles as compared with corresponding dopant distribution is shown in FIG. 2, as more fully described hereinafter.

Diffusion of dopant ions through a crystalline silicon lattice follows the basic differential equations of diffusion. If there is an impurity concentration gradient present, $dC/dx$, in a finite volume of a matrix substance, there will be a tendency for the impurity material to move so that the gradient decreases. If the flow persists for a sufficiently long time, the material will become homogeneous and the net flow of matter will cease. Fick's first law states that $$J = -D[dC(x,t)]/dx,$$

where
J is the flux of matter across a given plane, and D is the diffusion constant for the material that is diffusing in the specific host medium at a specific temperature. If Fick's first law is modified to include a concentration gradient decreasing with time, and assuming a thin layer of dopant as an initial condition, the concentration of dopants after thermal anneal at a specific temperature for a period of time is approximated by a Gaussian distribution.

The ions boron, arsenic, phosphorus, and antimony which are used as dopants in integrated circuit manufacturing, are all substitutional impurities, which situate themselves at lattice points in the silicon lattice. Recent models indicate that for many species of ions, diffusion between vacancies in the lattice is controlled both by the vacancy concentration and by the concentration of silicon interstitials, i.e., those Si atoms displaced from their lattice sites. These diffusion mechanisms occur in single crystal silicon. They are to be distinguished from different diffusion mechanisms which occur in polysilicon or amorphous silicon. In the single crystal case, the diffusion constant D of the substitutional impurity can be expressed as $$D = D_I + D_v,$$

where $D_I$ and $D_v$ are the interstitial and vacancy components of the diffusion coefficient. The relative values of $D_I$ and $D_v$ vary for different ions: The dopants boron, indium and phosphorus are believed to diffuse primarily via interstitial or interstitialcy mechanisms as shown in FIG. 3, which are described by S. Crowder in his *Ph.D. dissertation, Stanford University*, 1995, pp 41–43. The diffusivities of these dopants are therefore controlled mostly by Si interstitial concentration. Antimony diffusion is primarily vacancy-controlled, due to its large size which physically prohibits the ions from moving through the interstitial spaces. It therefore diffuses via the slow process of jumping from one vacancy to an adjacent vacancy. Some ions such as arsenic can move by both interstitial and vacancy mechanisms. Whereas vacancies are caused almost exclusively by the creation of point defects during implantation, silicon interstitials can also be caused by a kick-out effect upon commencement of annealing. In this case, a dopant ion kicks out one Si atom to become a substitutional, and the silicon atom becomes an excess interstitial. A model of interstitial profiles based on this mechanism, known as the +1 model, is described by M. Giles in *J. Electrochem Soc*, 138, 1160 (1991).

The presence of excess silicon interstitials in the vicinity of an implanted dopant distribution such as boron causes an effect known as Transient Enhanced Diffusion (TED). This effect is characterized by a gradient in the concentration profile of excess interstitials causing a large enhancement in dopant diffusion rate in the "downhill" direction of the negative gradient. This effect is short in duration, lasting only several minutes at temperatures as low as 800° C., and only seconds at higher temperatures, until the excess interstitials recombine or are otherwise removed from the vicinity of the dopant. However, during this short period, effective diffusivity of dopants can be enhanced by a factor of more than 10,000. Since the damage peak is positioned slightly shallower than the dopant peak, the enhanced diffusion tends to shift the dopants deeper into the silicon. As a result, the motion of the dopant atoms due to the damage created by the implant process is a primary determining factor of the final junction depths and profile shapes.

Intentional creation of damaged regions by implantation of electrically inactive species has been utilized to inhibit undesired positioning or motion of dopants. Kase et al, in U.S. Pat. No. 5,145,794 (1992) describe a method of inhibiting channeling during implantation. According to this method, argon is pre-implanted to create a partially crystalline disordered silicon layer, and thereafter boron is implanted directly into the disordered region. Using this method, boron channeling is largely avoided. The silicon damage can be repaired by subsequent anneal.

Similar methods have been proposed to inhibit dopant diffusion during post-implant anneal. Milgram et al, in *Appl. Phy. Lett.* 42, 878 (1983), describe pre-implantation of an argon dose which is sufficient to produce an amorphous layer, followed by implantation of boron into the amorphous region. The implanted argon causes a decrease in the diffusion of boron in the silicon during post-implant anneals up to temperatures of 900° C. The authors conclude that the boron atoms are trapped by the incorporated argon atoms. It is known that inhibition of dopant diffusion by creation of an amorphous layer causes problems because the defects induced thereby in the silicon crystal are not completely eliminated by a later annealing, but are partially retained, degrading the semiconductor device characteristics. Methods of inhibiting dopant diffusion in single-crystal silicon without causing amorphization are therefore needed.

SUMMARY OF THE INVENTION

I have provided a process for utilizing implant damage-induced interstitial gradients to inhibit dopant diffusion in crystalline silicon, thereby retaining shallow implanted junctions, and retarding lateral spreading of dopants under the gate of an MOS structure.

An object of this invention is to provide an improved process for providing shallow source/drain junctions for MOS devices.

Another object of this invention is to provide a process for retarding diffusion of dopant atoms implanted into crystalline silicon during subsequent high temperature processing cycles.

A further object of this invention is to provide a process for retarding subsequent diffusion of a region of implanted dopant atoms in crystalline silicon which process utilizes silicon interstitial gradients.

A further object of this invention is to provide a process for retarding subsequent diffusion of a region of implanted dopant atoms in crystalline silicon which utilizes an electrically inactive implant well below the dopant implant.

A further object is to provide a process for retarding subsequent diffusion of a region of implanted dopant atoms in crystalline silicon which does not cause formation of an amorphous layer in the silicon.

A further object of this invention is to provide an improved process for forming implanted source and drain regions in an MOS device which yields junction depths having less variation with subsequent processing steps.

A further object of this invention is to provide a process for forming implanted Lightly Doped Drain (LDD) structures in MOS devices which retards lateral spread of the LDD region under the gate.

A further object of this invention is to provide a MOS device using this process having shallow source/drain junction and having lowered lateral diffusion of LDD implant under the gate.

DETAILED DESCRIPTION OF THE INVENTION

According to this invention, in an integrated circuit manufacturing process employing ion implantation to dope a semiconductor, an electrically inactive species is implanted well beneath the dopant implant to retard diffusion of the implant deeper into the semiconductor.

Figure 1:
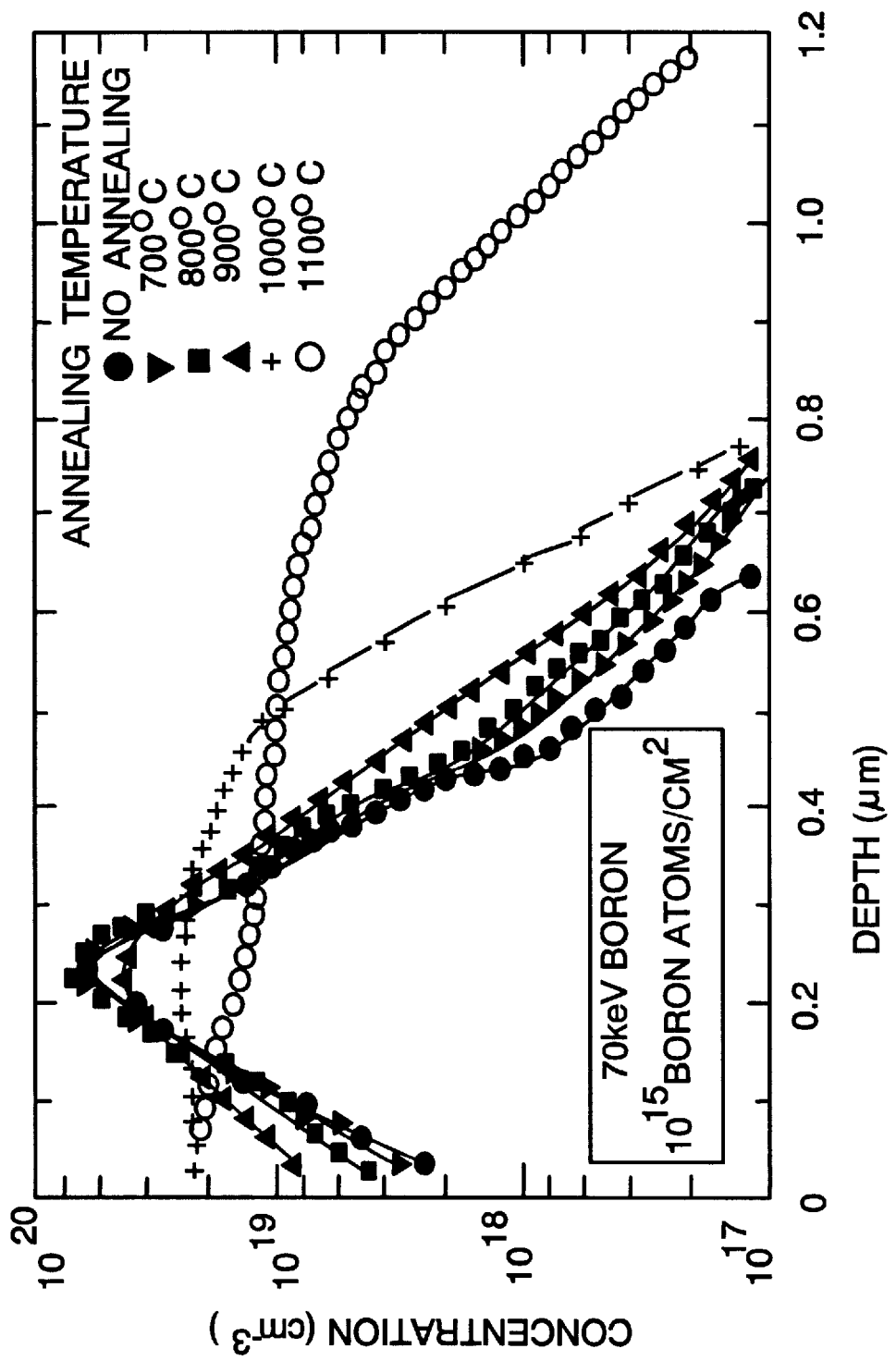
FIG. 1 is a graph of implanted boron profiles in single crystal silicon after anneal at various temperatures.

FIG. 1 shows a typical, well known, as-implanted profile of boron dopant atoms in single crystal silicon, along with profiles after 35 minute furnace anneals at temperatures ranging between 700° C. and 1100° C. The diffusion occurring during the anneal cycles broadens the dopant profiles and shifts the leading edge deeper into the substrate, causing the aforementioned problems in MOS device performance.

Figure 2:
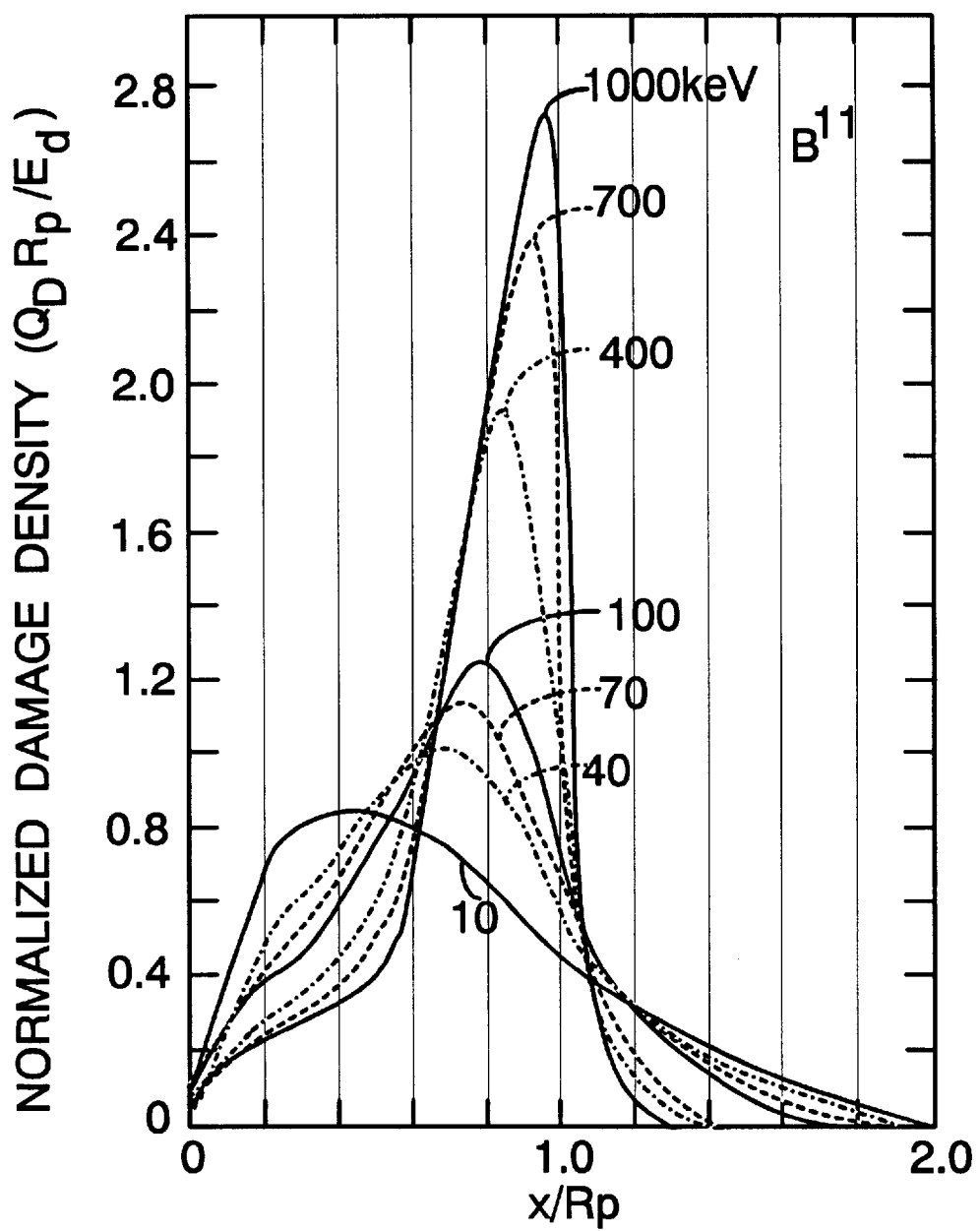
FIG. 2 is a graph of calculated damage profiles resulting from boron implantation at various energies.

FIG. 2 shows well known calculated damage density profiles caused by boron implantation at energies ranging between 10 KeV and 1000 KeV. The depth X into the sample is normalized by the projected range $R_p$ of the implanted ions themselves. The calculated damage density profiles are similar in shape to the ideal as-implanted boron profile, but the peak position is at a shallower depth than the dopant peak position. At higher implant energies the damage peak more closely coincides with the dopant peak.

Figure 3:
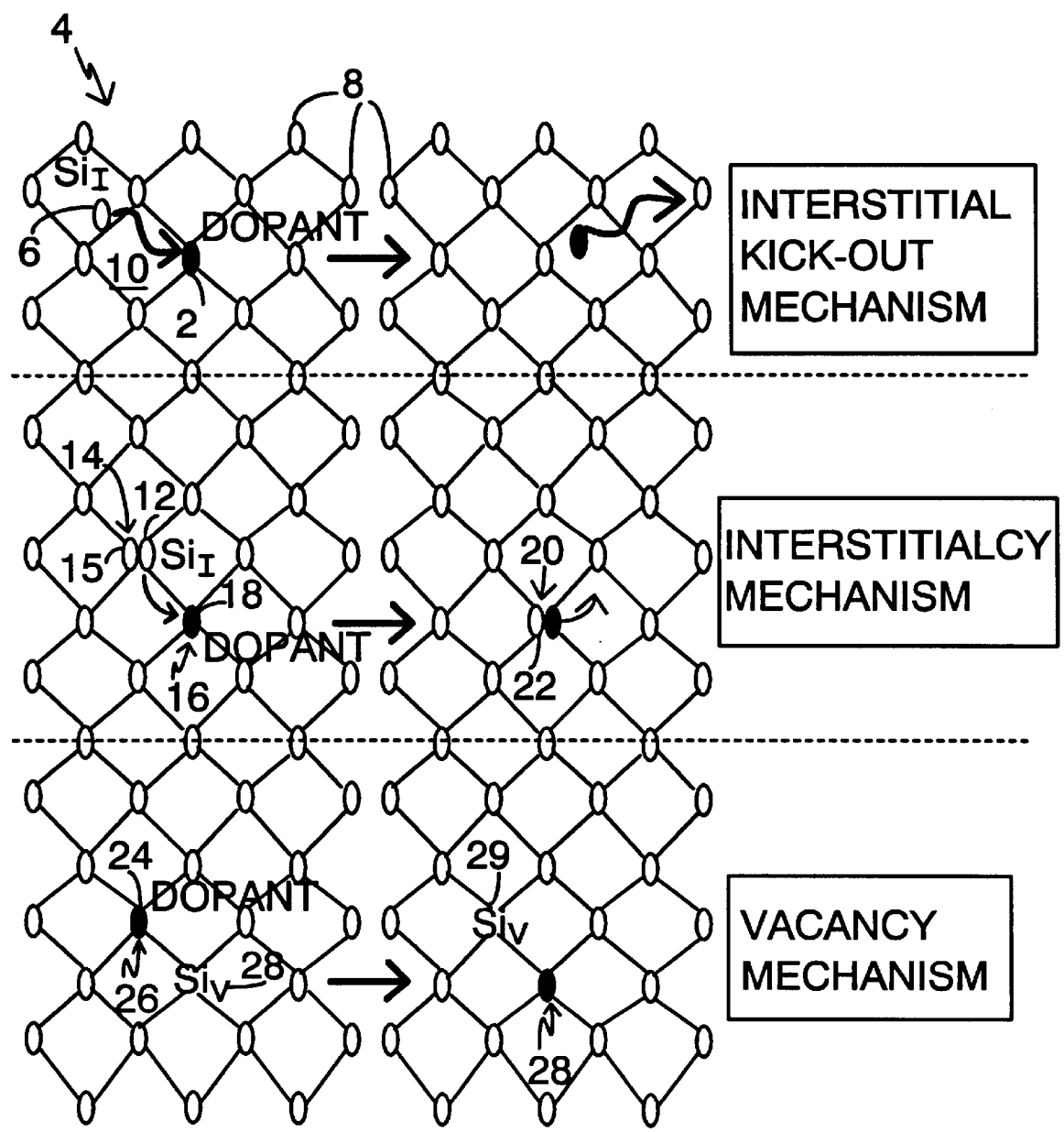
FIG. 3 is a schematic representation of boron diffusion mechanisms.

FIG. 3 shows a model of the motion of dopants through a silicon lattice via interstitial, interstitialcy, and vacancy mechanisms. In interstitial kickout, a substitutional dopant atom 2 in a lattice site of silicon lattice 4 is "kicked out" by a silicon interstitial atom 6, after which dopant atom 2 moves between lattice sites 8 through interstitial region 10 until it encounters another vacant site or itself kicks out an atom from an occupied site. The interstitialcy mechanism schematic shows a silicon interstitial atom 12 doubly occupying silicon lattice site 14 along with silicon atom 15. Interstitial 12 then moves to doubly occupy lattice site 16 along with dopant atom 18, which then moves to doubly occupy lattice site 20 with silicon atom 22. These interstitial and interstitialcy mechanisms, which are the dominant diffusion mechanisms for boron, indium, and phosphorus, provide for much faster diffusion rate than does the vacancy mechanism, whereby dopant atom 24 moves only from lattice site 26 to neighboring vacancy 28, leaving vacancy 29.

Figure 4:
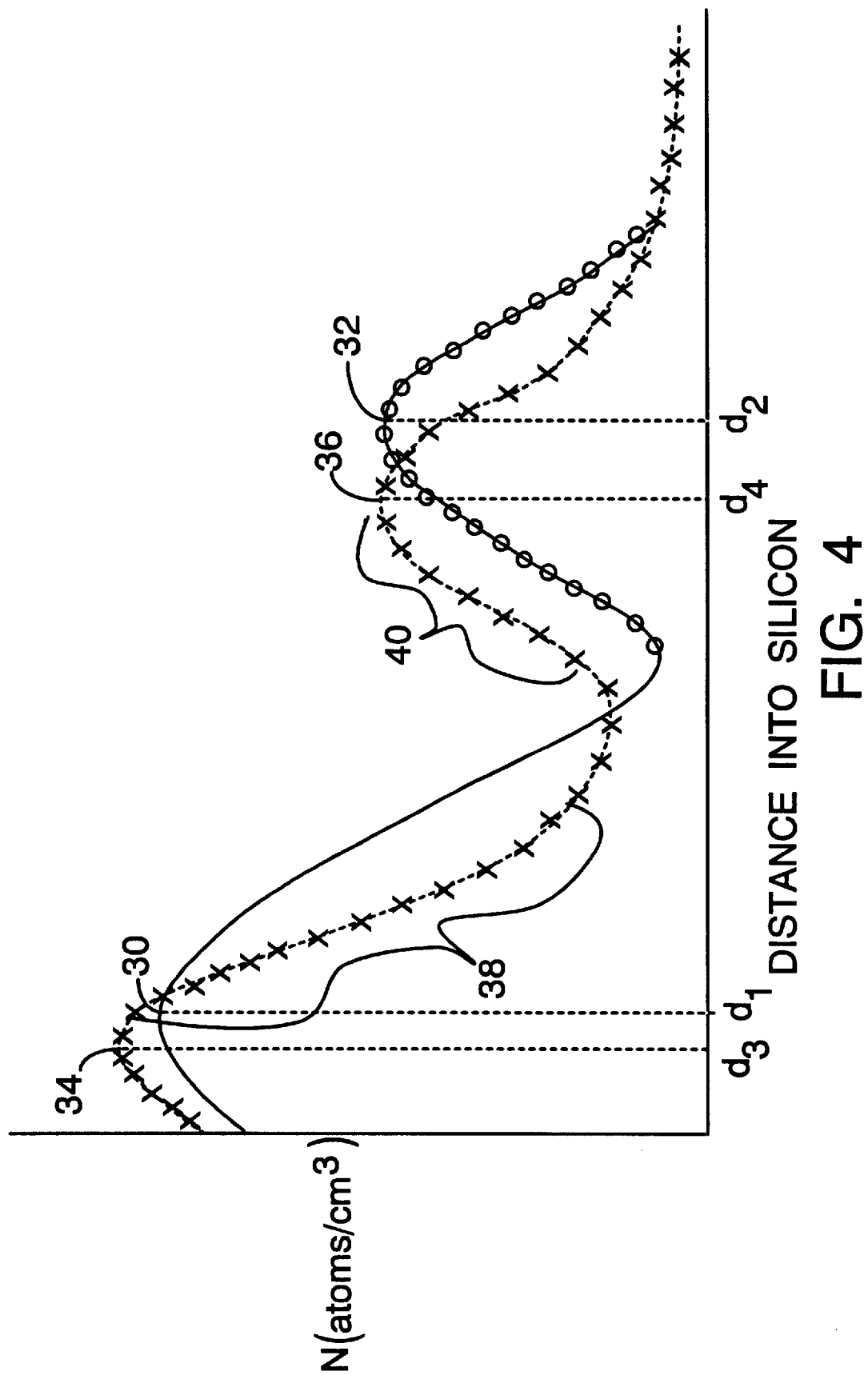
FIG. 4 is a graphical representation of implanted ion profiles and damage profiles for a double implant utilizing this invention.

With reference to FIG. 4, a concentration profile is shown for a double implant structure utilizing this inventive process. The structure comprises a dopant species, boron by way of example, having concentration peak 30 at depth $d_1$, and an electrically inactive species, argon by way of example, having concentration peak 32 at depth $d_2$, well below $d_1$. Damage from implantation of the dopant species results in silicon interstitial peak 34 at depth $d_3$, slightly shallower than depth $d_1$ of dopant peak 30. Similarly, damage from implantation of the electrically non-active species results in silicon interstitial peak 36 at depth $d_4$, slightly shallower than depth $d_2$ of peak 32, but deeper than depth $d_1$, of dopant peak 30. Interstitial gradient 38, which is negative towards greater depth, is associated with interstitial peak 34 and causes transient enhanced diffusion of the dopant into the silicon during subsequent anneal. This would increase junction depth if the dopant implant were a source/drain or LDD implant. However, the negative or "downhill" direction of interstitial gradient 40 associated with interstitial peak 36 from the electrically inactive species implant, is towards the surface. Gradient 40 would thereby oppose diffusion of the dopant deeper into the silicon during subsequent anneal. Gradient 38 is termed the "accelerating gradient", and gradient 40 is termed the "retarding gradient". To achieve the retarding effect, peak 32 is positioned sufficiently deeper than dopant peak 30 so that interstitial gradient 40 is deeper than the dopant atoms to be retarded. Implantation of the electrically inactive species, thereby forming a "retarding implant", may precede or follow implantation of the dopant species.

Figure 5:
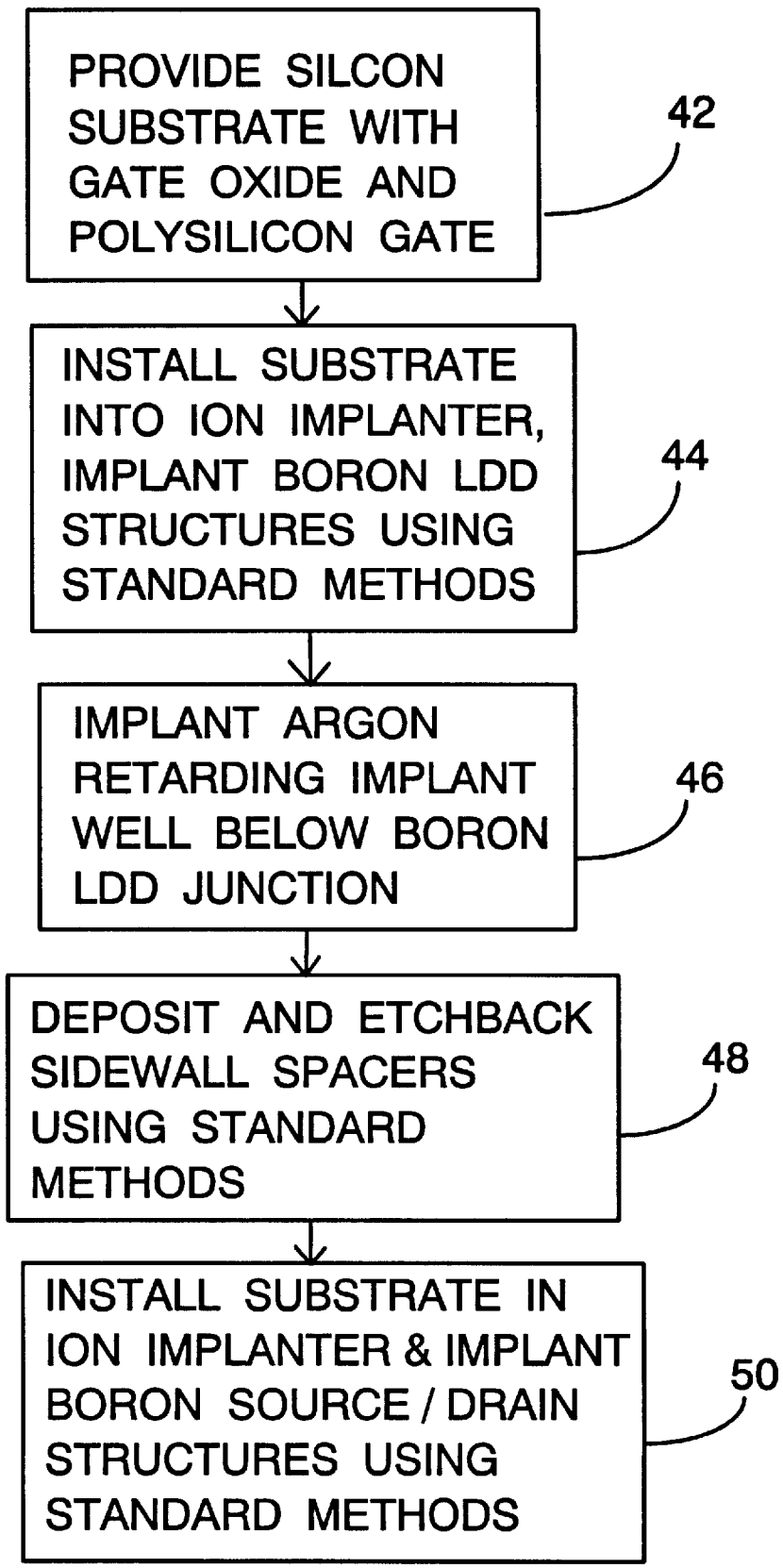
FIG. 5 is a process flow for a preferred embodiment of this invention.
Figure 6B:
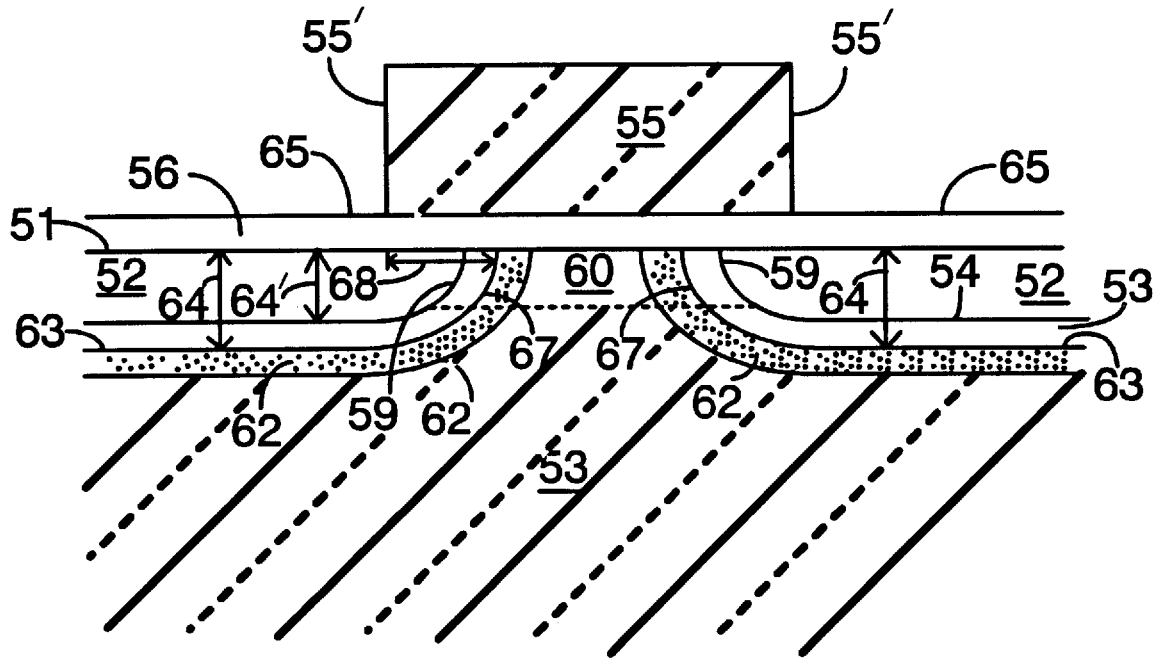
FIG. 6b is a schematic cross sectional view of an MOS structure having LDD implants and a retarding implant utilizing this invention.
Figure 7:
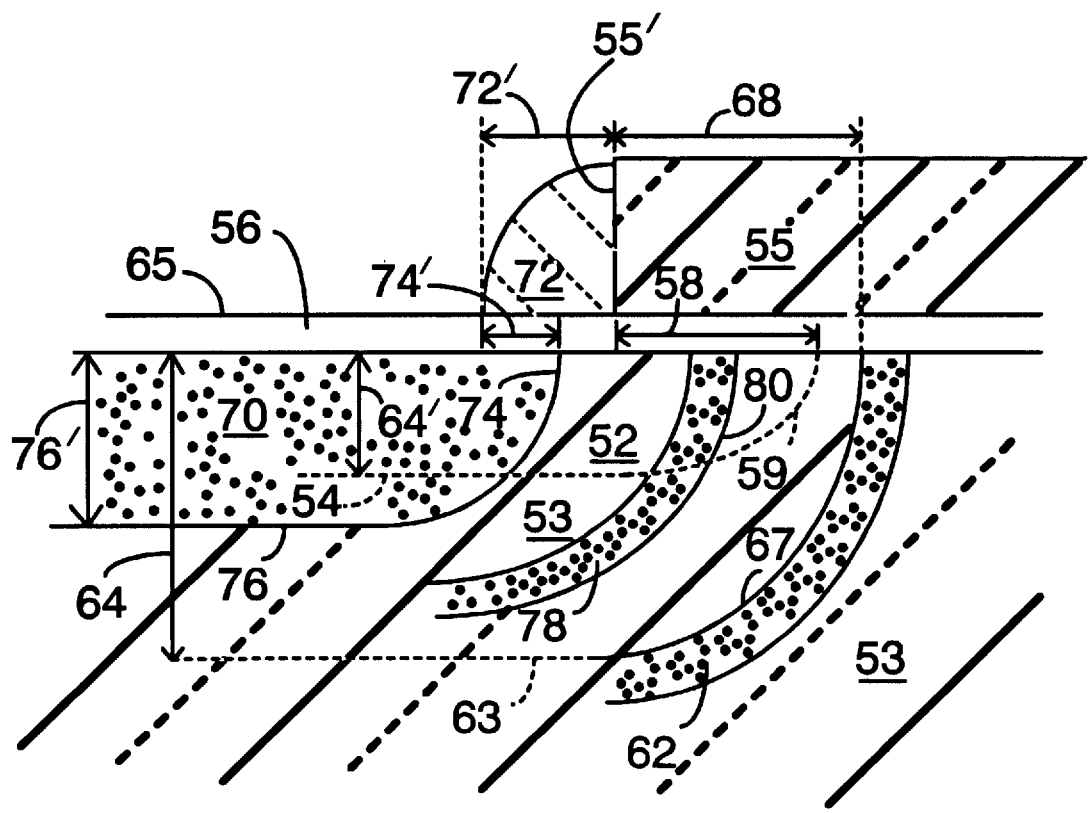
FIG. 7 is a cross sectional view of an MOS structure having LDD and source/drain implants and retarding implants of varying energies.

With reference to FIG. 5, a process flow is shown for a preferred embodiment of my invention as it would be applied to the source/drain and LDD implants of a PMOS transistor with a polysilicon gate, as illustrated in FIG. 7. In Step 42, a silicon substrate is provided having a grown gate oxide at its surface and having a polysilicon gate thereon. In Step 44, implantation of boron LDD structures is performed, using standard methods with the polysilicon gate serving as an implant mask, and the implanted dopant species ions penetrating the substrate in the regions not covered by the polysilicon. Typical doses for Step 44 implant are 4–5 E13/cm$^2$, energies of 25–35 KeV using BF$_2^+$ ions as the implanted Boron containing species. In Step 46, a further implantation is performed, this time with argon, at a 1E13 to 1E14/cm$^2$ dose range with the polysilicon gate serving as the implant mask, and with the implantation energy which is generally in the 300–400 KeV range, selected so that the resulting non-active argon concentration peak is positioned well below the LDD implant (FIG. 6b, 62). In Step 48, gate sidewall spacers of 1000–1500 Å width are generally formed using standard deposition and etchback techniques (FIG. 7, 72). Sidewall spacers are not always required, so this step may be optional. In Step 50, implantation of source/drain structures is performed, using standard methods, with the polysilicon gate (and sidewall spacers) serving as an implant mask. Typical S/D implantation parameters are in the ranges of 50–100 KeV energy, 1E15 to 5E15/cm$^2$ dose. Standard Rapid Thermal Anneal (RTP) steps may be implemented during the process. These are typically in the range of 980°–1050° C. for 30 to 60 seconds.

Figure 6A:
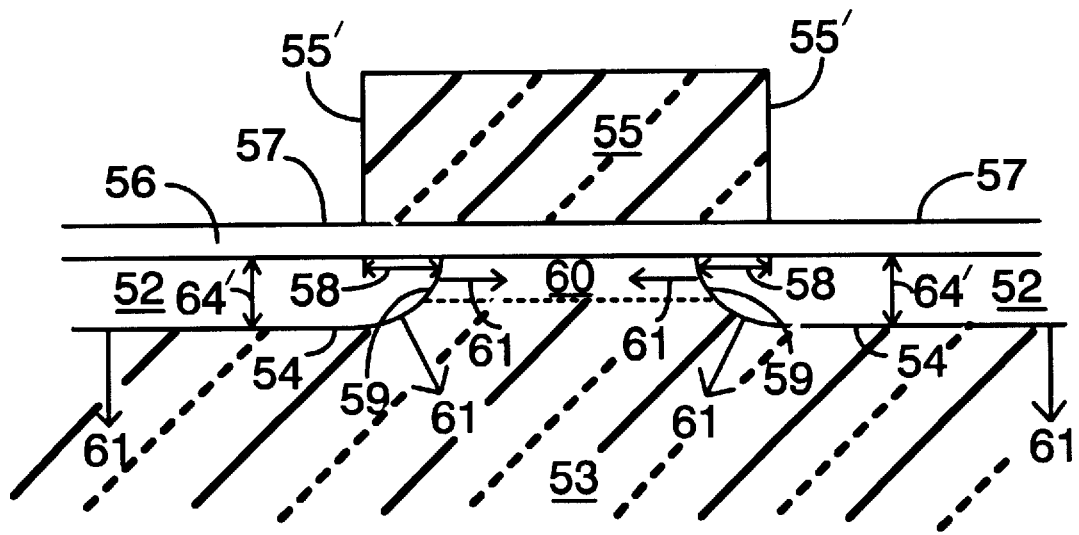
FIG. 6a is a schematic cross sectional view of a prior art MOS structure having LDD implants.

With reference to prior art FIG. 6a, LDD regions with implants 52 of boron, by way of example, are shown in silicon substrate 53, having surface 51 with junction 54, 59 there between. Polysilicon gate 55 having edges 55' is over gate oxide 56 and serves as a mask for implants 52. The implanted ions penetrate into the substrate through regions 57 not covered by polysilicon 55. Side scatter during implantation causes LDD implants to extend laterally beneath gate 55 a lateral distance 58, to lateral junction portion 59. The vertically displaced junction portion 54 at depth 64' and lateral junction portion 59 together comprise the "leading edge" of the LDD implant. Channel 60 is disposed between implants 52. Without utilizing my invention, annealing results in diffusion of implants 52 and causes motion of the dopant atoms in the direction of arrows 61, causing junction portion 54 to deepen and channel 60 to shorten.

With reference to FIG. 6b, according to my invention, additional retarding implants 62 of an electrically inactive species, argon by way of example, are positioned with trailing edge portions 63 forming a boundary portion between the inactive implant 62 and the substrate, 53 at a vertical depth 64 well below depth 64' LDD implant junctions 54. Polysilicon gate 55 serves as a mask for retarding implants 62, the implanted ions penetrating into the substrate through regions 65 not covered by polysilicon 55. Side scatter causes lateral trailing edge portions 67 of implants 62 to extend a lateral distance 68 beneath gate 55 which is greater than the lateral distance 58 of edges 59 of the LDD active species implant, edge portion 67 thereby forming a second boundary portion. In this case, dopant and damage profiles in the lateral direction are equivalent to those extending vertically into the substrate, as previously described. Therefore, the presence of the retarding implants further beneath the gate both impedes lateral diffusion of LDD active species implants into channel region 60, thereby decreasing short-channel effects for a given gate dimension, and also impedes vertical diffusion of the active species into the substrate.

With reference to FIG. 7, showing LDD region 52, sidewall spacer 72, and source/drain structures, the LDD implant 52 extends under gate 55 a distance 58 to junction portion 59. Source/drain implant 70 is masked by polysilicon gate 55 and by sidewall spacer 72, and extends laterally to form junction portion 74. Source/drain vertical displaced junciton portion 76 is deeper than LDD junction portion 54, but source/drain lateral junction portion 74 does not extend as far under gate 55 as does LDD lateral junction portion 59. Electrically inactive retarding implants 78, 62 having different implantation energies are shown. Lower energy implant 78 extends deeper than both source/drain junction 76 and LDD junction 54. However, its lateral edge 80 is between junction 59 of LDD implant and junction 74 of source/drain implant. Therefore, while implant 78 would retard lateral diffusion of source/drain implant 70, it would enhance and accelerate lateral spread of LDD implant 52. Higher energy retarding implant 62 is positioned deeper (63) than both source/drain junction 76 and LDD junction 54. Additionally, its lateral edge 67 extends further beneath gate 55 than do junction 59 of LDD implant and junction 74 of source/drain implant. Implant 62 would retard both vertical and lateral diffusion of LDD and source/drain implants. Optimum energy of the retarding implant depends on LDD implant energy and dose, source/drain energy and dose, width of sidewall spacer, and temperature and duration of post-implant heat cycles. By way of example, for a case where the LDD spacer oxide width is ~1300 Å, the $N^+$ implant is $As^+$ implanted @ 80 KeV, the NLDD implant is Phosphorous implanted @ 25 KeV and baked at 900° C. for approximately 45 minutes, the retarding implant 62 will be implanted at an energy chosen, in the 300–400 KeV range, to reach its Rp (measured laterally under the gate, not vertically) at 3000 Å, with the resultant peak of interstitials at 2400Å.

Utilizing my invention, diffusion of dopants during high temperature post-anneal processing will be retarded by the opposing interstitial gradient. This effect, while transient in nature, is expected to have large impact on final dopant profiles, since it will occur during the critical period of transient enhanced diffusion caused by the damage from the retarding implant. As a result of my invention, source-drain junctions will diffuse less and therefore remain shallower, and lateral spread of LDD implants into the channel region will be decreased. The process will not cause formation of an amorphous layer because the retarding implant doses are only in the range of 1E13 to 1E14, therefore implant damage will be repaired by subsequent anneal steps. The process is easily incorporated into standard MOS manufacturing process flows.

Whereas the invention as described utilizes a boron LDD and source/drain implant and an argon retarding implant following LDD implant, it is not essential that this exact process be followed. By way of example, the retarding implant could be performed before the LDD implant, using the gate as a mask, or it could be performed after the sidewall spacers were formed, either before or after the source/drain implant. In this case, a higher retarding implant energy would be required to position the lateral edge of the retarding implant further under the gate than the lateral edge of the LDD implant. Also by way of example, this invention would also be effective in retarding arsenic or phosphorus LDD and source/drain implant diffusion. Additionally, the retarding implant could be comprised of any electrically inactive species, preferably of relatively low atomic mass. The scope of the invention should be construed in light of the claims. With this in mind,

I claim:

1. An intermediate integrated circuit product formed adjacent a surface (51) of a silicon substrate (53), said intermediate product comprising:

a gate electrode (55), said gate electrode being mounted above said silicon substrate surface (51); a portion of said silicon substrate surface (51) not beneath said gate electrode being a first surface portion (65), said gate electrode having an edge (55') which also defines the edge of said first surface portion;

a first implanted dopant region (52) in said substrate, said first implanted dopant region having an active dopant concentration peak therein, said first implanted dopant region also having a first leading edge (54, 59) forming a first junction between said first implanted dopant region and said substrate, said first junction having both a first junction portion (54) at a first depth (64') below said first surface portion and a second junction portion (59) which curves back to intersect said surface of said substrate at a first lateral distance (58) measured along said silicon surface from said edge (55') of said first surface portion;

a second crystalline implanted region (62) in said substrate, said second crystalline implanted region having an electrically inactive species concentration peak and an implantation damage peak therein, said second crystalline implanted region not being amorphous, said second crystalline implanted region having a trailing edge, said trailing edge (63,67) forming a boundary between said second crystalline implanted region (62) and said substrate (53), said boundary having a first boundary portion (63) at a second depth (64) below said first surface portion and a second boundary portion (67) which curves back to intersect said surface of said substrate at a second lateral distance (68) measured along said silicon surface from said edge (55') of said first surface portion, said second depth (64) being substantially larger than said first depth (64'), and said second lateral distance (68) being larger than said first lateral distance (58).

2. An intermediate integrated circuit product formed adjacent a surface (51) of a silicon substrate, said product being an MOS structure having a conductive gate, implanted source/drain, and Lightly Doped Drain regions, comprising:

a gate oxide (56) on said surface of said silicon substrate;

a gate electrode (55), said gate electrode being mounted above said silicon substrate surface (51); a portion of said silicon substrate surface (51) not beneath said gate electrode being a first surface portion (65), said gate electrode having an edge (55') which also defines the edge of said first surface portion;

a first implanted dopant region (52) in said substrate, said first implanted dopant region having an active dopant concentration peak therein, said first implanted dopant region also having a first leading edge (54, 59) forming a first junction between said first implanted dopant region and said substrate, said first junction having both a first junction portion (54) at a first depth (64') below said first surface portion and a second junction portion (59) which curves back to intersect said surface of said substrate at a first lateral distance (58), measured along said silicon surface from said edge (55') of said first surface portion;

a sidewall spacer (72), said sidewall spacer abutting said gate edge, said spacer having a width (72') and additionally covering a second portion of said surface of said silicon substrate, said second portion of said surface of said silicon substrate being a portion of said first surface portion of said surface of said silicon substrate;

a second implanted dopant region (70) extending beneath said sidewall spacer, said second implanted dopant region having a second dopant concentration peak therein and having a second leading edge (76, 74) forming a second junction located between said second implanted dopant region and said substrate, said second junction having a first junction portion (76) at a second depth (76') below said surface, and a second junction portion (74) which curves back towards and intersects said surface of said silicon substrate after extending under said sidewall spacer a second lateral distance (74') measured along said single surface of said silicon substrate, said second lateral distance (74') being less than the sum of said sidewall spacer width (72') and said first lateral distance (58);

a third crystalline implanted region (62) including an implanted electrically inactive species beneath said gate and said sidewall spacer, said third crystalline implanted region having an electrically inactive species concentration peak therein, and having a trailing edge (67, 63), said trailing edge forming a boundary between said third crystalline implanted region (62) and said substrate (53), said boundary having a first boundary portion (63) at a third depth (64) below said surface of said silicon substrate and a second boundary portion (67) which curves back toward and intersects said surface of said silicon substrate under said gate at a third lateral distance (68) measured along said surface of said silicon substrate from said gate edge (55'), said third depth (64) being larger than both said first depth (64') and said second depth (76'), and said third lateral distance (68) being larger than said first lateral distance (58).

3. The product of claim 1, wherein said concentration peak of said electrically inactive species is at a distance in the range between 500–1000 Å from said dopant concentration peak of said first region.

4. The product of claim 3, wherein said active dopant is selected from a group consisting of boron, arsenic, and phosphorus.

5. The product of claim 4, wherein said electrically inactive species comprise argon.

6. The product of claim 2, wherein said concentration peak of said electrically inactive species is at a distance in the range between 500–1000 Å from said dopant concentration peak of said first region.

7. The product of claim 6, wherein said dopant is selected from a group consisting of boron, arsenic, and phosphorus.

8. The product of claim 7, wherein said electrically inactive species are selected from the group consisting of argon, silicon, neon, helium and germanium.

9. The product of claim 8, wherein said dopants in each said implanted dopant region have been implanted with specified dose, and where said first dopant dose is in the range between 1E13 to 5E13, said second dopant dose is in the range between 1E15 to 5E15, said third region inactive species dose is in the range between 1E13 to 1E14, and said sidewall spacer width is in the range between 1000–1500 Å.

* * * * *